(12) United States Patent
Zhou

(10) Patent No.: US 7,233,144 B2
(45) Date of Patent: Jun. 19, 2007

(54) METHOD AND SYSTEM FOR PERFORMING IMAGE RECONSTRUCTION IN A MAGNETIC RESONANCE IMAGING SYSTEM

(75) Inventor: Yong Zhou, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/077,754

(22) Filed: Mar. 11, 2005

(65) Prior Publication Data
US 2006/0202693 A1    Sep. 14, 2006

(51) Int. Cl.
*G01V 3/00* (2006.01)
(52) U.S. Cl. ....................... 324/309; 324/307
(58) Field of Classification Search .............. 324/309, 324/306, 307, 318, 319, 322, 300, 312; 600/407, 600/410
See application file for complete search history.

(56) References Cited

U.S. PATENT DOCUMENTS

| | | | |
|---|---|---|---|
| 5,631,560 A | * | 5/1997 | Machida ..................... 324/309 |
| 6,411,836 B1 | * | 6/2002 | Patel et al. .................. 600/407 |
| 6,448,771 B1 | * | 9/2002 | Harvey et al. .............. 324/307 |
| 6,505,064 B1 | * | 1/2003 | Liu et al. ..................... 600/420 |
| 6,553,248 B1 | * | 4/2003 | Gagnon et al. ............. 600/407 |
| 6,720,770 B2 | * | 4/2004 | Biglieri et al. .............. 324/322 |
| 6,784,664 B2 | * | 8/2004 | Liang et al. ................ 324/309 |

OTHER PUBLICATIONS

Barger AV, Block WF, Toropov Y, Grist TM, Mistretta CA, Time-resolved contrast-enhanced imaging with isotropic resolution and broad coverage using an under-sampled 3D projection trajectory, Magnetic Resonance in Medicine, Aug. 2002, 297-305, vol. 48(2).
M Frigo, SG Johnson, FFTW: An Adaptive Software Architecture for the FFT, ICASSP conference proceedings, 1998, 1381-1384, vol. 3.

* cited by examiner

*Primary Examiner*—Brij B. Shrivastav
(74) *Attorney, Agent, or Firm*—The Small Patent Law Group LLP; Dean D. Small

(57) ABSTRACT

Methods and Systems for image reconstruction in magnetic resonance imaging (MRI) are provided. The method includes receiving MRI data and storing the received MRI data. The method further includes reordering the stored MRI data during an image reconstruction.

20 Claims, 7 Drawing Sheets

METHOD AND SYSTEM FOR PERFORMING IMAGE RECONSTRUCTION IN A MAGNETIC RESONANCE IMAGING SYSTEM

BACKGROUND OF THE INVENTION

This invention relates generally to medical imaging systems, and more particularly, to methods and systems for performing image reconstruction in a Magnetic Resonance Imaging (MRI) system.

With an increase in image resolution and complexity in three-dimensional (3D) imaging in Medical Resonance Imaging (MRI), large volumes of MRI data are generated while performing MRI scans. During image construction, the MRI data is typically processed by performing a Fast Fourier Transform (FFT). The FFT is used for backprojecting the MRI data. This, FFT process is often the most time consuming process in the image reconstruction.

The FFT is performed by computing machines or processors that usually operate using a hierarchical architecture for storing data. The MRI data in these computing machines may be stored at four different levels, namely in a hard disk, a Random Access Memory (RAM), a cache memory, and a plurality of registers. With respect to the four levels, the hard disk can store the maximum volume of data and the register can store the minimum. However, the rate at which the data can be accessed for performing image reconstruction is maximum for the register and minimum for the hard disk. As a result, MRI data is stored in the RAM, and for efficiently performing image reconstruction, a part of the MRI data is transferred to the cache memory.

In the RAM, the 3D MRI image data is stored linearly. Thus, only one of three dimensions of the stored image data is contiguous in the RAM, and the other two dimensions are spaced apart across the RAM. As a result of this linear storage, the access of data (while performing a FFT) along the dimension for which the data is contiguous is efficient. The access of data along the other two dimensions is less efficient as this data is stored in different non-contiguous locations in the RAM. As a result, when the cache memory sends a request to RAM to access data along these two dimensions, a significant amount of time may be required to identify and locate the data along these two dimensions. In addition, due to the spaced apart storage of data along these two dimensions, cache misses may occur while accessing this data.

BRIEF DESCRIPTION OF THE INVENTION

In an exemplary embodiment of the invention, a method for image reconstruction in magnetic resonance imaging (MRI) is provided. The method includes receiving MRI data and storing the received MRI data. The method further includes reordering the stored MRI data during an image reconstruction.

In another exemplary embodiment of the invention, a MRI system is provided. The MRI system includes a scan portion for acquiring MRI data and a memory for storing the acquired MRI data. The MRI system further includes a processor network configured to remap the stored MRI data during an image reconstruction.

DETAILED DESCRIPTION OF THE INVENTION

Various embodiments of the invention provide a method and a system for reconstructing a 3-Dimensional (3D) Magnetic Resonance Imaging (MRI) data. Specifically, various embodiments of the invention provide a method and system for reordering the MRI data before image reconstruction. The method is performed by remapping or swapping the data, for example, across two dimensions, before the image reconstruction. In various embodiments of the invention, the image reconstruction includes performing a plurality of Fourier Transforms on the MRI data, as is known.

Figure 1:
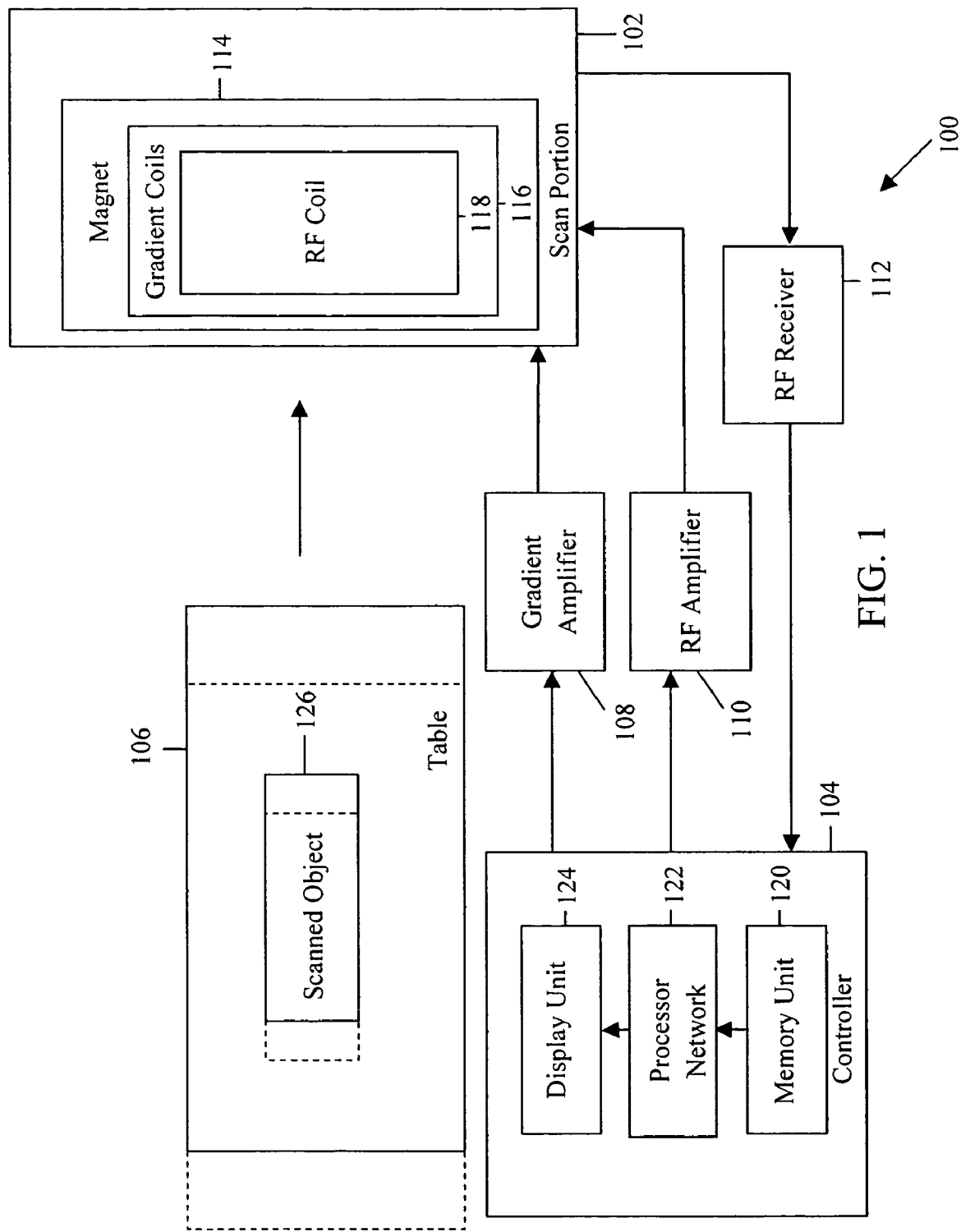
FIG. 1 is a block diagram of an MRI system in accordance with an embodiment of the invention.

FIG. 1 is a block diagram of an MRI system 100 in accordance with an exemplary embodiment of the invention. MRI system 100 generally includes a scan portion 102, a controller 104, a table 106, a gradient amplifier 108, an RF amplifier 110 and an RF receiver 112. Scan portion 102 includes a magnet 114, a set of gradient coils 116 and an RF coil 118. Controller 104 includes a memory unit 120, a processor network 122 (e.g., a plurality of interconnected processors) and a display unit 124.

In an embodiment of the invention, an object 126 (e.g., patient) to be scanned is placed on table 106. MRI data of object 126 is obtained by scan portion 102. This is achieved through application of a magnetic field generated by magnet 114, a magnetic gradient field generated by set of gradient coils 116 and Radio Frequency (RF) pulses generated by RF coil 118, as is known. In an embodiment of the invention, the magnetic field is produced by magnet 114, wherein, for example, a superconducting magnet extends through the entire magnet 114 and generates a homogenous magnetic field throughout its length. Furthermore, the gradient applied by set of gradient coils 116 produces a linear variation in the magnetic field along a desired direction. Thereafter, RF pulses generated by RF coil 118 in combination with the fields excite protons in object 126. These protons consequently produce analog signals, which in various embodiments of the invention, can be converted to digital signals with the use of an analog to digital converter (not shown). The amplitudes of these signals are dependent on relaxation characteristics and spin densities of the protons present in object 126.

In accordance with various embodiments of the invention, the digital signals are received by RF coil 118. These signals are then converted to readable MRI data in a digital format and communicated to controller 104 through RF receiver 112, for image reconstruction. The MRI data received by controller 104 is stored in memory unit 120. In accordance with an embodiment of the invention, image reconstruction is performed by processor network 122 and the resultant image is displayed on display unit 124. In various embodiments of the invention, processor network 122 may include, for example, a set of processors that can communicate with each other to perform image reconstruction on the MRI data. In an embodiment of the invention, processor network 122 performs multiple Fourier transforms on the MRI data received by memory unit 120 as is known. In another embodiment of the invention, processor network 122 performs a Fast Fourier transformation on the MRI data received by memory unit 120 as is known. In accordance with an alternative embodiment of the invention, a plurality of RF receivers 112 may be used for communicating the MRI data from scan portion 102 to controller 104.

In accordance with various embodiments of the invention, processor network 122 is configured to define and/or specify the shape of the gradient pulses produced by set of gradient coils 116. In accordance with an alternative embodiment of the invention, processor network 122 is also used to define and/or specify the shape of the RF pulses generated by RF coil 118. The desired shape of the gradient pulses and the RF pulses are communicated by processor network 122 to gradient amplifier 108 and RF amplifier 110, respectively. The amplified gradient signals generated from gradient amplifier 108 are communicated to set of gradient coils 116. Additionally, amplified RF signals generated from RF amplifier 110 are communicated to RF coil 118. Thereafter, the set of gradient coils 116 generate a gradient based on signals received from gradient amplifier 108, while RF coil 118 generates a radio frequency based on signals received from RF amplifier 110. The effect of the above variations in amplification causes modified signals to be generated from object 126. These modified signals are received by RF coil 118. These modified signals are converted to a readable MRI data and processed accordingly. A final image is generated and displayed on display unit 124.

In various embodiments of the invention, memory unit 120 may be, for example, a magnetic or an optical storage media, such as a hard disk, a tape drive, or a memory chip. Memory unit 120 also may be other similar means for loading computer programs or other instructions into the computer system. Further, display unit 124 may include, for example, a cathode ray display, a LCD display, or a plasma display. In various embodiments of the invention, memory unit 120 and processor network 122 may be configured according to, for example, a blade server architecture, wherein each blade server includes a motherboard having memory unit 120, processor network 122, network connections, and associated electronics.

Figure 2:
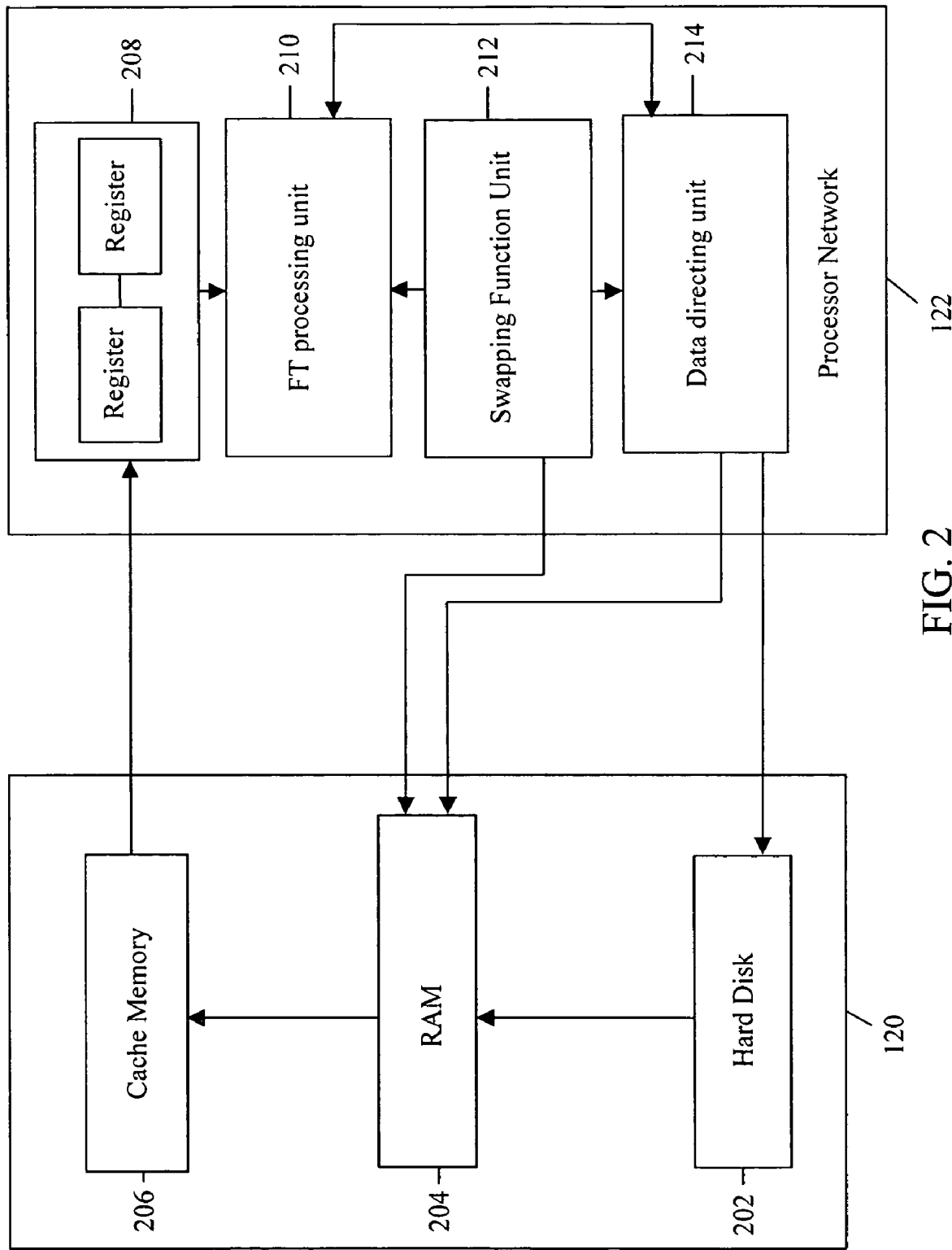
FIG. 2 is a block diagram illustrating the communication between a memory unit and a processor network of the MRI system of FIG. 1.

FIG. 2 is a block diagram illustrating the communication between memory unit 120 and processor network 122. In various embodiments of the invention, memory unit 120 includes a hard disk 202, a Random Access Memory (RAM) 204 and a cache memory 206. Processor network 122 includes a plurality of registers 208, a Fourier Transform (FT) processing unit 210, a swapping function unit 212 and a data controller, for example, a data-directing unit 214. In accordance with an embodiment of the invention, swapping function unit 212 remaps or swaps the data, for example, along two directions and as described in more detail herein.

In an embodiment of the invention, the MRI data, when received from scan portion 102, is in the form of a 3D volumetric data set. The 3D volumetric data set includes voxels, wherein each voxel is raw data in k-space and has a numeric value associated therewith. The numerical value represents a measurable property in each scan direction. The measurable property may be, for example, the strength of the signal that constitutes the MRI data.

In various embodiments of the invention, the MRI data is stored in RAM 204 for use by processor network 122 to perform image reconstruction. The remapping or swap operation may be performed by sequentially swapping values along two dimensions of the MRI data, with the data stored along a particular direction. The swap operation is explained in more detail with reference to FIG. 5.

In accordance with an embodiment of the invention, once the MRI data has been stored in RAM 204, it is communicated to cache memory 206 where the data may be accessed by registers 208. The data in registers 208 is accessed by FT processing unit 210. FT processing unit 210 performs a Fourier transform on the MRI data as is known. In various embodiments of the invention, the Fourier transform comprises performing a one-dimensional Fast Fourier Transforms (FFT) on the MRI data. Thereafter, the reconstructed MRI data is communicated to data directing unit 214. Data directing unit directs the data to RAM 204. Subsequently, swapping function unit 212 accesses this data and swaps or remaps this data along the second direction. Accordingly, the data along the second direction is stored contiguously. The data is then communicated to registers 208 from where FT processing unit 210 accesses the data for performing a one-dimensional Fourier transform along the second direction. The same process is then repeated for performing a Fourier transform along the third direction.

When a desired or required number of Fourier transforms have been performed as described above, data directing unit 214 provides the magnitude of the processed data from RAM 204 to hard disk 202.

Figure 3:
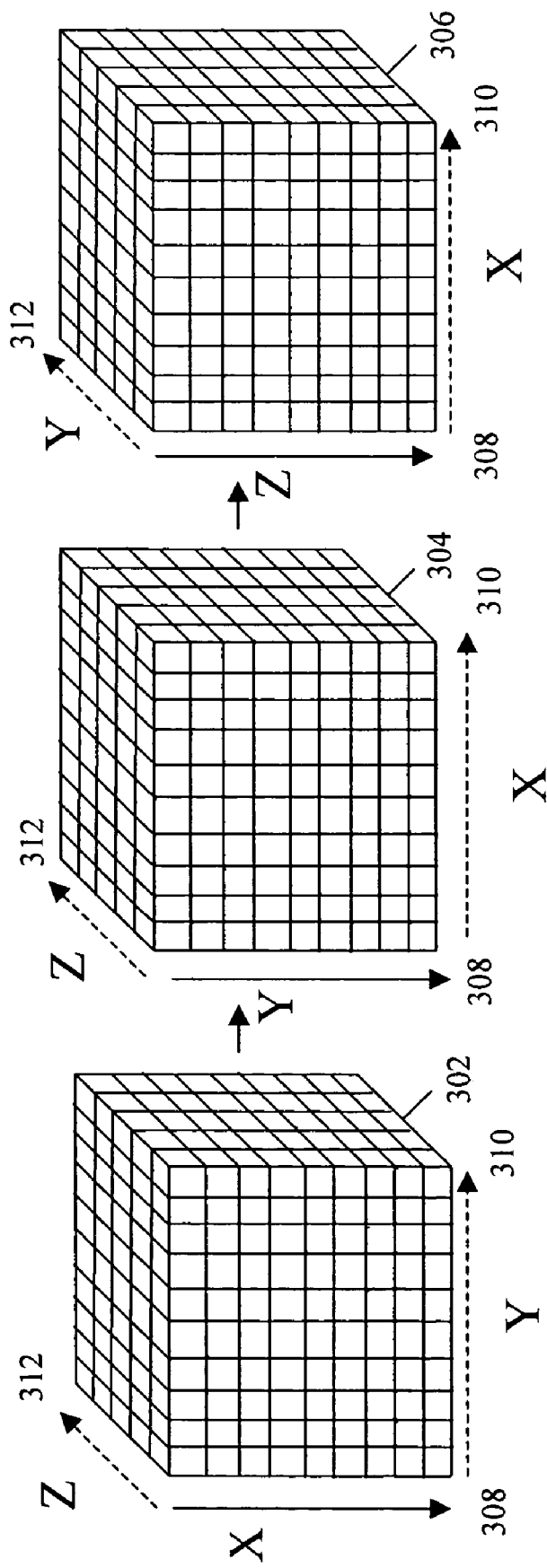
FIG. 3 illustrates exemplary 3D volumetric data sets that are used for performing a Fourier transform in accordance with various embodiments of the invention.

FIG. 3 illustrates exemplary 3D volumetric data sets that are used for performing the Fourier transform described with reference to FIG. 2. Each 3D volumetric data set, namely block 302 (e.g., data block), block 304, and block 306 comprise voxels (as described with reference to FIG. 2). Each block is generated from the signals that comprise the MRI data received from scan potion 102. In an embodiment, the three dimensions of the block correspond to three different spatial encodings, namely, frequency encoding, phase encoding, and slice encoding, as is known.

In accordance with various embodiments of the invention, the Fourier Transform is performed along contiguous data stored linearly in RAM 204. Block 302 shows the MRI data before a Fourier Transform is performed along a direction 308. With reference to block 302, the swap operation along direction 308 (direction X in block 302) is not performed because the data is already stored contiguously. Block 302 is thus used for performing a Fourier transform as described with reference to FIG. 5.

After the Fourier transform is performed for block 302, a remapping or swap operation is performed for block 304. At this stage, and for example, the address values of the data stored along direction 310 (direction Y in block 302) are swapped with the address values of the data stored along direction 308 (direction X in block 302). After the swap operation is performed, the swapped data along direction 308 (direction Y in block 304) is used for performing a Fourier transform as described with reference to FIG. 5. Similar to the swapping in block 304, a swap operation is also performed for block 306, wherein the address values of the MRI data stored along direction 312 (direction Z in block 304) are swapped with the address values of the data stored along direction 308 (direction Y in block 304). Thereafter, a Fourier transform is performed on this data stored along direction 308 (direction Z in block 308). The method for performing the remapping or swap operation is explained with reference to FIG. 5

Figure 4:
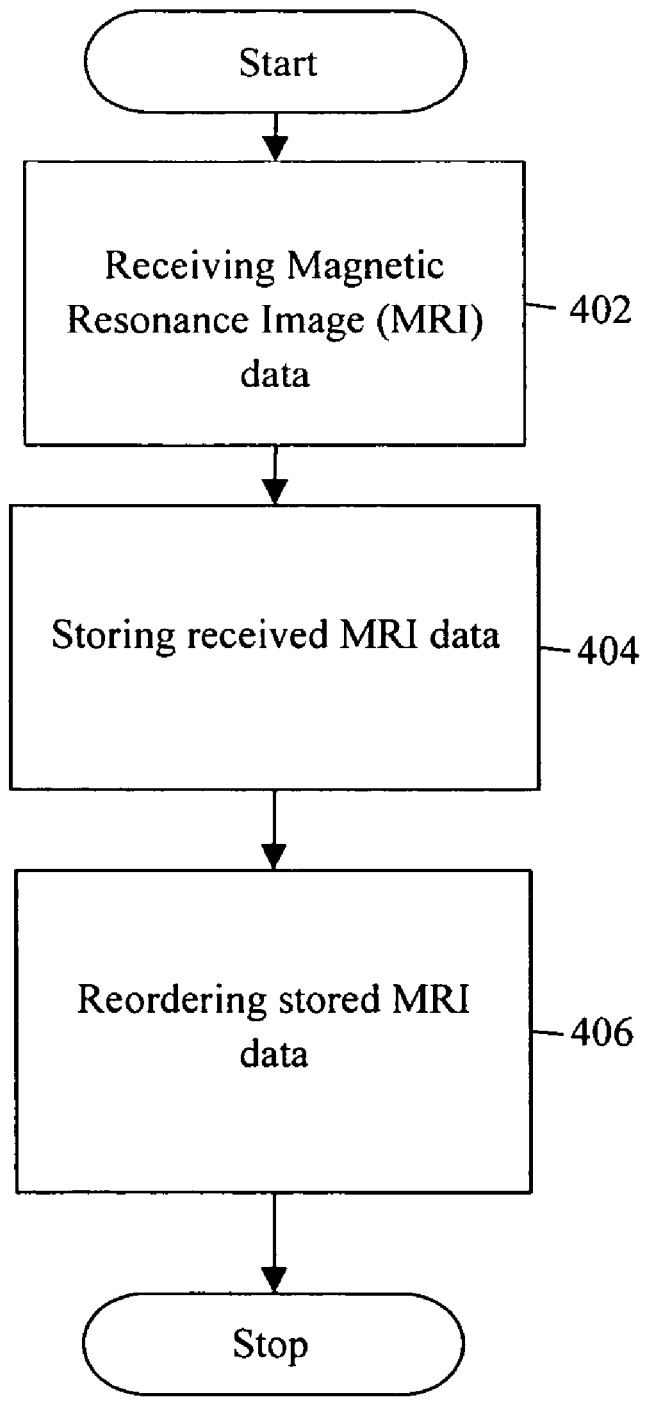
FIG. 4 is a flowchart of a method for image reconstruction in accordance with an embodiment of the invention.

FIG. 4 is a flowchart for image reconstruction in accordance with an embodiment of the invention. Specifically, at 402, MRI data is received by scan portion 102 (shown in FIG. 1). At 404, the MRI data is stored in memory unit 120 (shown in FIG. 1). At 406, the MRI data is reordered (e.g., swapped or remapped) according to the various embodiments and methods described with reference to FIG. 3 and FIG. 5.

Figure 5A:
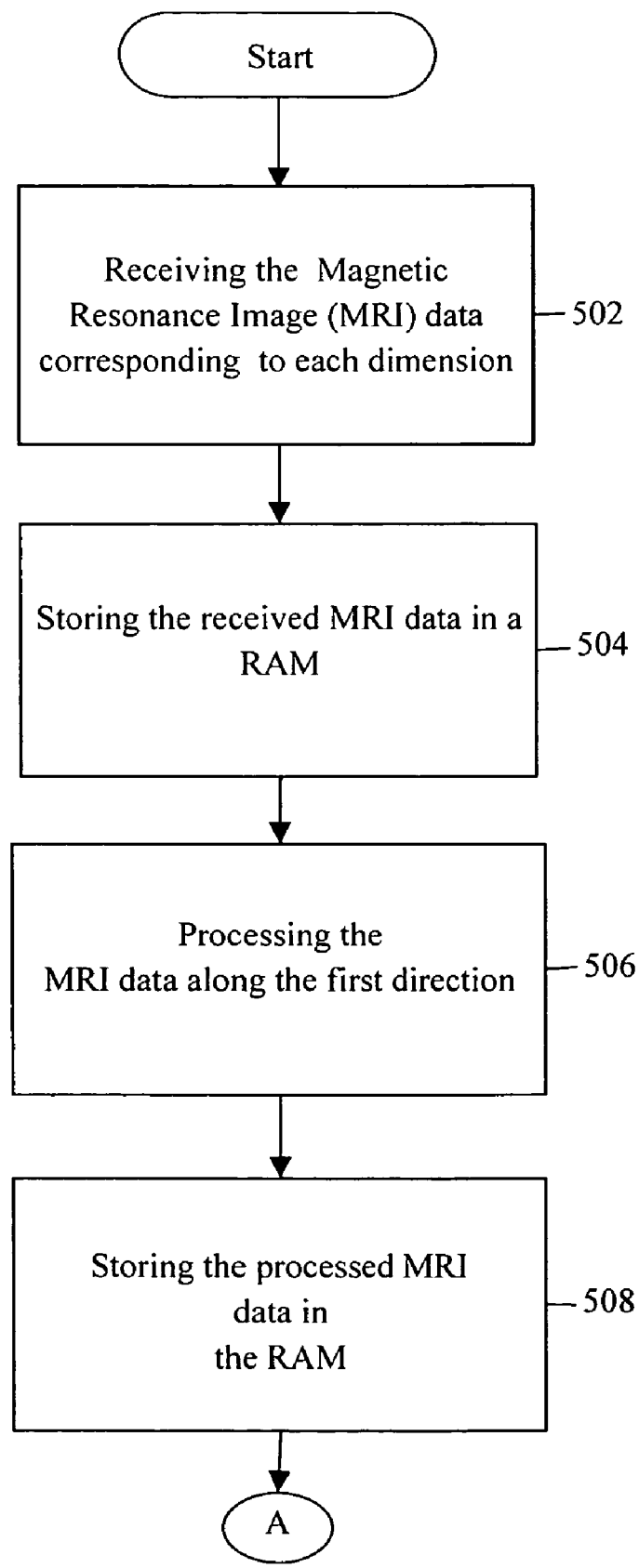
FIG. 5 is a flowchart method for reordering data for use in image reconstruction in accordance with an embodiment of the invention.
Figure 5B:
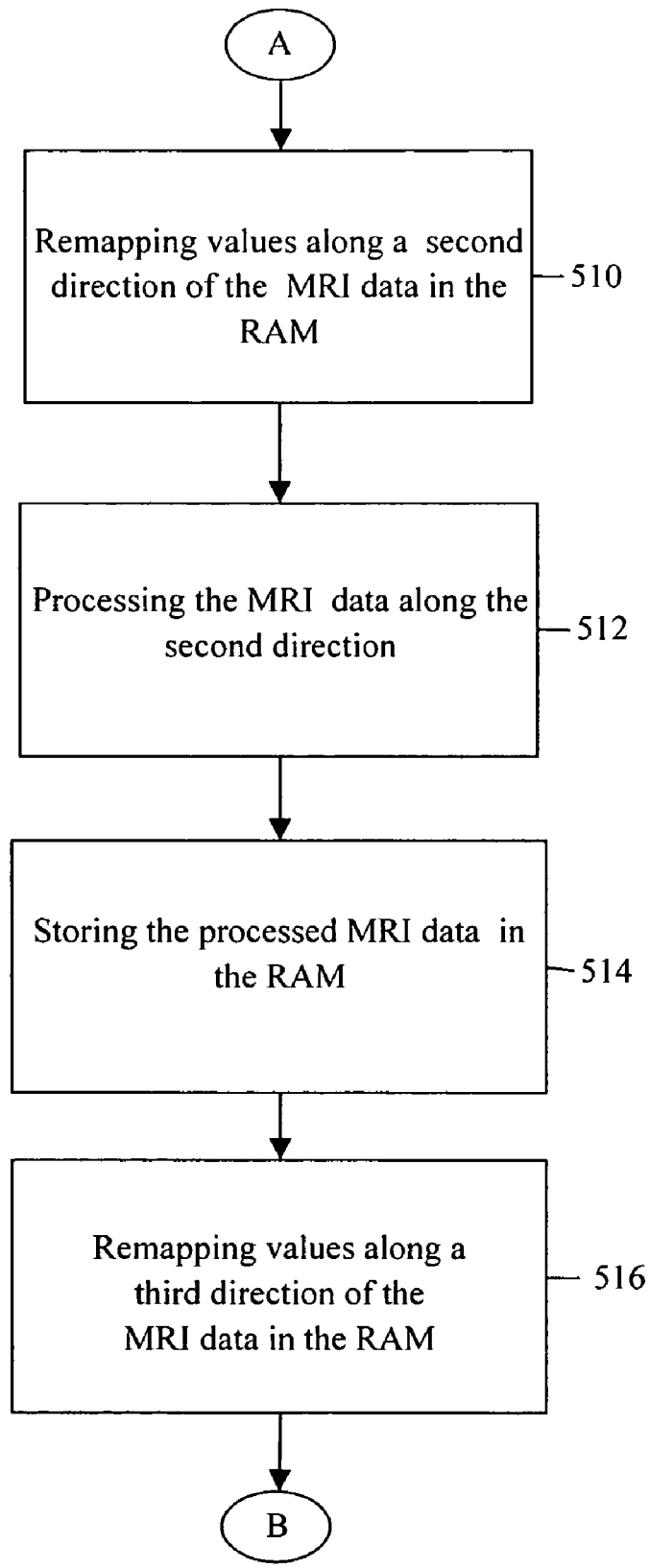
Figure 5C:
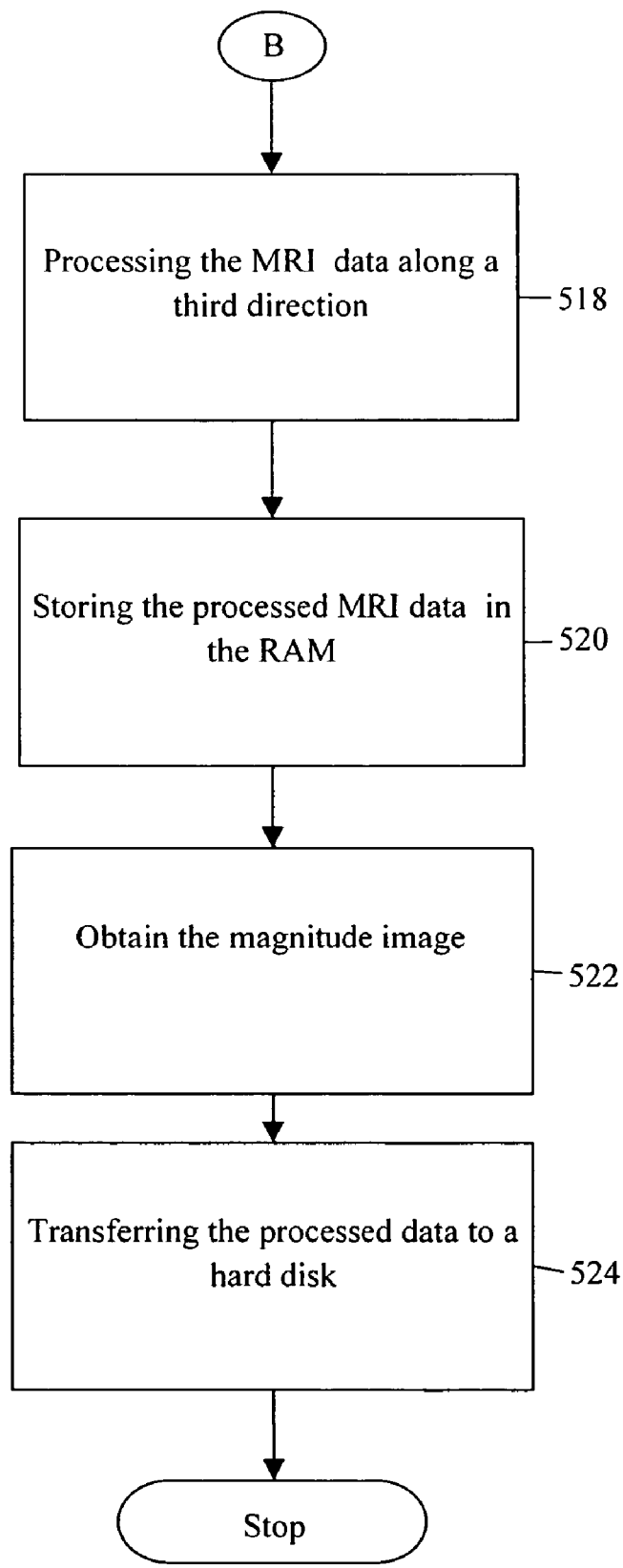

FIG. 5 is a flowchart for reordering (e.g., swapping or remapping) the MRI data, in accordance with an embodiment of the invention. At 502, 3D MRI data is received from scan portion 102 (shown in FIG. 1). MRI data for different scan dimensions may correspond to the data stored along, for example, direction 308, direction 310 and direction 312 (shown in FIG. 3). At 504, the MRI data is stored in memory unit 120 (shown in FIG. 1). In accordance with an embodiment of the invention, the MRI data is stored in RAM 204 (shown in FIG. 2). At 506, the MRI data is communicated to processor network 122 (shown in FIG. 1) for performing a Fourier transform according to the method described with reference to FIG. 2. The Fourier transform is performed on the values of the data corresponding to direction 308, wherein the data is stored contiguously as a result of being acquired contiguously. The Fourier transform of the MRI data may be performed using schemes or methods for image reconstruction known in the art. At 508, the processed data is stored in RAM 204.

At 510, the address values corresponding to data corresponding to a second direction, such as direction 310 are remapped with the address values of the data stored along direction 308. In various embodiments of the invention, the remapping includes swapping the address values corresponding to direction 310 with the address values of the data stored along direction 308 such that the values corresponding to direction 310 are now stored or addressable contiguously. Accordingly, the values corresponding to direction 308 are stored along direction 310. It should be noted that the readdressing is not necessarily performed on a one to one basis. For example, the position of data in the direction 310 relative to other data in direction 310 also may be swapped. Additionally, when reference is made herein to storing values along a direction, this refers to remapping or swapping values to different memory locations, wherein the data stored corresponds to, for example, data scanned in a particular direction or axis (e.g., corresponding to real 3D image data scanned in three directions).

At 512, the swapped MRI data is communicated to processor network 122 for performing a Fourier transform. The Fourier transform is performed on data values along direction 308 using the new remapped data, which data was previously stored in connection with direction 310. Thus, for example, scan data in y-direction (direction Y in block 302) may now be processed instead of scan data in x-direction (direction X in block 302). At 514, the processed data is stored in RAM 204 (as described with reference to FIG. 2).

At 516, the remapping is performed for values of the MRI data stored in direction 312. The remapping includes swapping the address values of the data corresponding to direction 312 with the address values of the data stored along direction 308. Accordingly, the values along direction 308 are stored along direction 312 (or direction 310, with the values along direction 310 stored in direction 312).

At 518, the swapped MRI data at 516 is communicated to processor network 122 for performing a Fourier transform. The Fourier transform performed on data values corresponding to direction 308 the new remapped data, which data was previously stored in connection with direction 312. At 520, all the processed MRI data (e.g., processed for all three directions) is stored in RAM 204. In various embodiments of the invention, the magnitude of the processed MRI data (complex k-space) is computed to form the image at 522. Thereafter, the processed MRI data is stored in hard disk 202, at 524.

Various embodiments of the invention provide a method for accessing data from memory unit 120 and swapping values corresponding to, for example, two dimensions, to allow for faster access of the MRI data used for performing the Fourier transform. The faster access decreases the processing time required for performing the Fourier transform on the MRI data. MRI system 100 may include any suitable component parts, such as, for example, a plurality of Intel® Pentium™ processors having processing speed of 1.9 GHz in processor network 122, with a cache memory of 256 Kilobytes (KB), a 1 GigaByte (GB) RAM, and an operating system using Linux 2.4.1. For this system, the speed up factor after performing the swapping operation may be 1.76 times faster. The speed up factor is defined as, but not limited to, the ratio of the time (in micro seconds) for a specific task using an algorithm known in the art for image reconstruction, to the time spent (in micro seconds) for the specific task using the algorithm described herein. The times may be measured using precision timing as is known. In an alternative embodiment, processor network 122 includes a plurality of Intel® Xeon™ processors having a processing speed of 2.66 GHz with a cache memory of 512 KB, a memory of 2 GB RAM. The speed up factor in this system may be up to 2.20 times faster.

Various embodiments of the invention reduce the number of cache misses that occur during the accessing of the data used for performing the Fourier Transform. The cache misses are reduced as the swapping of the values allows localizing of the data before each Fourier transform is performed.

In various embodiments of the invention, the remapping or swapping of data may be referred to as reordering or rearranging of data.

A technical effect of various embodiments of the invention is faster access of the MRI data by the processor network performing the Fourier transform. The access rate is improved by swapping MRI data in the RAM. This localizes the MRI data while performing the Fourier transform in the given direction.

The Fast Fourier Transform along each dimension of the image can be performed using a software package such as, for example, Fastest Fourier Transform in the West (FFTW), which is a C subroutine library.

The various embodiments or components of the various embodiments of the invention may be implemented as part of any suitable computer system. The computer system may include, for example, a computer, an input device, a display unit and an interface, for example, for accessing the Internet and provided as part of the MRI system 100. The computer may include a microprocessor. The microprocessor may be connected to a communication bus. The Memory Unit may include a Read Only Memory (ROM) in addition to the RAM. The computer system may further include a storage device, which includes not only the hard disk, but also may be a removable storage drive such as a floppy disk drive, optical disk drive, and the like. The storage device can also be other similar means for loading computer programs or other instructions into the computer system.

As used herein, the term "computer" may include any processor-based or microprocessor-based system including systems using microcontrollers, reduced instruction set circuits (RISC), application specific integrated circuits (ASICs), logic circuits, and any other circuit or processor capable of executing the functions described herein. The above examples are exemplary only, and are thus not intended to limit in any way the definition and/or meaning of the term "computer."

The computer system executes a set of instructions that are stored in one or more storage elements, in order to process input data. The storage elements may also hold data or other information as desired or needed. The storage element may be in the form of an information source or a physical memory element within the processing machine.

The set of instructions may include various commands that instruct the processing machine to perform specific operations such as the processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

While the invention has been described in terms of various specific embodiments, those skilled in the art will recognize that the invention can be practiced with modification within the spirit and scope of the claims.

What is claimed is:

1. A method for image reconstruction in magnetic resonance imaging, said method comprising:
   receiving magnetic resonance image data defining a volumetric data set;
   storing the received magnetic resonance image data; and
   reordering the stored magnetic resonance image data during an image reconstruction by swapping the address values of the stored magnetic resonance image data.

2. A method in accordance with claim 1 wherein the received magnetic resonance image data is stored in a memory and the reordering comprises remapping the stored magnetic resonance image data in the memory.

3. A method in accordance with claim 1 wherein the image reconstruction comprises a Fourier Transform and wherein the reordering is performed before each of a plurality of Fourier Transform processes.

4. A method in accordance with claim 3 wherein the magnetic resonance image data comprises data in three dimensions and wherein the reordering is performed before the Fourier Transform of the data for two dimensions.

5. A method in accordance with claim 3 wherein the Fourier Transform comprises a Fast Fourier Transform.

6. A method in accordance with claim 1 wherein the reordering comprises remapping the stored magnetic resonance image data dynamically based on the magnetic resonance image data being used for image reconstruction.

7. A method in accordance with claim 1 wherein the received magnetic resonance image data is stored in a memory and the reordering comprises rearranging the stored magnetic resonance image data in the memory.

8. A method in accordance with claim 1 wherein the reordering comprises remapping the stored magnetic resonance image data sequentially in a memory based on a dimension corresponding to the stored magnetic resonance image data.

9. A method in accordance with claim 1 wherein the reordering comprises swapping in a memory the received magnetic resonance image data.

10. A method for image reconstruction in magnetic resonance imaging, said method comprising:
    receiving magnetic resonance image data corresponding to each of three dimensions of a magnetic resonance image scan;
    storing the received magnetic resonance image data in a memory defining at least one data block wherein each of the three dimensions corresponds to a different spatial encoding; and
    remapping the stored magnetic resonance image data for data corresponding to each of the three dimensions before each of a processing step corresponding to processing the data for each of the three dimensions to reconstruct an image.

11. A method in accordance with claim 10 wherein each processing step comprises Fourier Transforming the magnetic resonance image data.

12. A method in accordance with claim 10 wherein the storing comprises sequentially storing the magnetic resonance image data in a Random Access Memory (RAM).

13. A method in accordance with claim 12 wherein the remapping is performed on the magnetic resonance image data stored in the RAM.

14. A method in accordance with claim 10 further comprising performing a three-dimensional volumetric Fast Fourier Transform to reconstruct the image.

15. A method in accordance with claim 10 further wherein the remapping comprises localizing the magnetic resonance image data for the next processing step.

16. A method in accordance with claim 10 wherein the remapping comprises readdressing the stored magnetic resonance image data.

17. A magnetic resonance imaging system comprising:
    a scan portion for acquiring magnetic resonance image data;
    a memory for storing the acquired magnetic resonance image data; and
    a processor network configured to remap the stored magnetic resonance image data during an image reconstruction by swapping the address values of the stored magnetic resonance image data.

18. A magnetic resonance imaging system in accordance with claim 17 wherein the processor is configured to perform a Fast Fourier Transform on the stored magnetic resonance image data.

19. A magnetic resonance imaging system in accordance with claim 17 wherein the magnetic resonance image data corresponds to three dimensions of scanning and wherein the processor is configured to remap the stored magnetic resonance image data prior to performing image reconstruction using data corresponding to each of the three two dimensions.

20. A magnetic resonance imaging system in accordance with claim 17 wherein the processor is configured to perform three-dimensional image reconstruction using the stored magnetic resonance image data.

* * * * *